(12) United States Patent
Oxland et al.

(10) Patent No.: US 9,214,555 B2
(45) Date of Patent: *Dec. 15, 2015

(54) BARRIER LAYER FOR FINFET CHANNELS

(71) Applicant: Taiwan Semiconductor Manufacturing Co. Ltd., Hsin-Chu (TW)

(72) Inventors: Richard Kenneth Oxland, Brussels (BE); Mark van Dal, Heverlee (BE); Martin Christopher Holland, Leuven (BE); Georgios Vellianitis, Heverlee (BE); Matthias Passlack, Huldenberg (BE)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 30 days.

This patent is subject to a terminal disclaimer.

(21) Appl. No.: 13/795,786

(22) Filed: Mar. 12, 2013

(65) Prior Publication Data

US 2014/0264592 A1 Sep. 18, 2014

(51) Int. Cl.
*H01L 29/78* (2006.01)
*H01L 29/66* (2006.01)

(52) U.S. Cl.
CPC ........ *H01L 29/785* (2013.01); *H01L 29/66795* (2013.01)

(58) Field of Classification Search
USPC ..................................... 257/192, 185; 438/44
See application file for complete search history.

(56) References Cited

U.S. PATENT DOCUMENTS

| | | | |
|---|---|---|---|
| 6,023,079 A * | 2/2000 | Hida | 257/192 |
| 6,635,921 B2 * | 10/2003 | Yi et al. | 257/316 |
| 6,803,631 B2 | 10/2004 | Dakshina-Murthy et al. | |
| 6,947,275 B1 * | 9/2005 | Anderson et al. | 361/303 |
| 6,958,512 B1 | 10/2005 | Wu et al. | |
| 7,074,623 B2 | 7/2006 | Lochtefeld et al. | |
| 7,122,865 B2 * | 10/2006 | Holzl et al. | 257/352 |
| 7,176,041 B2 * | 2/2007 | Lee et al. | 438/8 |
| 7,545,008 B2 | 6/2009 | Chan et al. | |

(Continued)

FOREIGN PATENT DOCUMENTS

| | | | |
|---|---|---|---|
| KR | 20060062048 A | | 6/2006 |
| KR | 201152432 A | * | 5/2011 |
| KR | 20110052432 A | | 5/2011 |

OTHER PUBLICATIONS

Biegel, Bryan A.; Osman, Mohamed A.; Yu, Zhipin, "Analysis of Aluminum—Nitride SOI for High-Temperature Electronics", NASA technical document, 2000, http://ntrs.nasa.gov/archive/nasa/casi.ntrs.nasa.gov/20010073753.pdf.*

(Continued)

*Primary Examiner* — Eduardo A Rodela
*Assistant Examiner* — Vincent Wall
(74) *Attorney, Agent, or Firm* — Eschweiler & Associates, LLC

(57) ABSTRACT

Integrated circuit devices having FinFETs with channel regions low in crystal defects and current-blocking layers underneath the channels to improve electrostatic control. Optionally, an interface control layer formed of a high bandgap semiconductor is provided between the current-blocking layer and the channel. The disclosure also provides methods of forming integrated circuit devices having these structures. The methods include forming a FinFET fin including a channel by epitaxial growth, then oxidizing a portion of the fin to form a current-blocking layer.

18 Claims, 17 Drawing Sheets

(56) References Cited

U.S. PATENT DOCUMENTS

| | | | |
|---|---|---|---|
| 7,799,592 B2 * | 9/2010 | Lochtefeld | 438/44 |
| 8,048,723 B2 | 11/2011 | Chang et al. | |
| 8,263,462 B2 | 9/2012 | Hung et al. | |
| 8,283,653 B2 * | 10/2012 | Pillarisetty et al. | 257/20 |
| 8,455,307 B2 | 6/2013 | Cho | |
| 8,610,249 B2 * | 12/2013 | Di Sarro et al. | 257/532 |
| 8,823,060 B1 * | 9/2014 | Colinge et al. | 257/192 |
| 2006/0284255 A1 | 12/2006 | Shin et al. | |
| 2007/0020833 A1 | 1/2007 | Mears et al. | |
| 2007/0020860 A1 | 1/2007 | Mears et al. | |
| 2007/0085140 A1 | 4/2007 | Bassin | |
| 2007/0090443 A1 * | 4/2007 | Choi et al. | 257/314 |
| 2008/0093674 A1 * | 4/2008 | Lee et al. | 257/365 |
| 2009/0206410 A1 | 8/2009 | Mitani | |
| 2010/0144121 A1 | 6/2010 | Chang et al. | |
| 2010/0163971 A1 | 7/2010 | Hung et al. | |
| 2011/0171795 A1 | 7/2011 | Tsai et al. | |
| 2011/0193141 A1 | 8/2011 | Lin et al. | |
| 2011/0210393 A1 | 9/2011 | Chen et al. | |
| 2011/0248322 A1 | 10/2011 | Wong et al. | |
| 2012/0061649 A1 | 3/2012 | Datta et al. | |
| 2012/0292672 A1 | 11/2012 | Cho | |
| 2013/0043507 A1 | 2/2013 | Wu et al. | |
| 2013/0264617 A1 | 10/2013 | Joshi et al. | |
| 2013/0270513 A1 | 10/2013 | Romero et al. | |
| 2013/0302956 A1 | 11/2013 | Flachowsky et al. | |
| 2014/0008734 A1 | 1/2014 | Lu | |
| 2014/0054648 A1 | 2/2014 | Itokawa et al. | |
| 2014/0054650 A1 | 2/2014 | Colinge | |
| 2014/0061815 A1 | 3/2014 | Jagannathan et al. | |
| 2014/0097487 A1 | 4/2014 | Yen et al. | |

OTHER PUBLICATIONS

Machine translation of KR 10-2011-0052432.*
Tan, et al., "Hafnium Aluminum Oxide as Charge Storage and Blocking-Oxide Layers in SONOS-Type Nonvolatile Memory for High-Speed Operation", IEEE Trans. on Elec. Dev., vol. 53, No. 4, Apr. 2006, pp. 654-662.*
U.S. Appl. No. 13/771,249, filed Feb. 20, 2013 with USPTO.
Notice of Allowance Dated May 7, 2014 U.S. Appl. No. 13/771,249.
Office Action Dated Aug. 19, 2014 KR Patent Application No. 10-2013-0094082.
Ko, et al. "Ultrathin compound semiconductor on insulator layers for high-performance nanoscale transistors." Nature, vol. 468. Nov. 11, 2010.
Blum, et al. "Wet thermal oxidation of AlAsSb lattice matched to InP for optoelectronic applications." Applied Physics Letters 68, 3129, May 27, 1996.

* cited by examiner

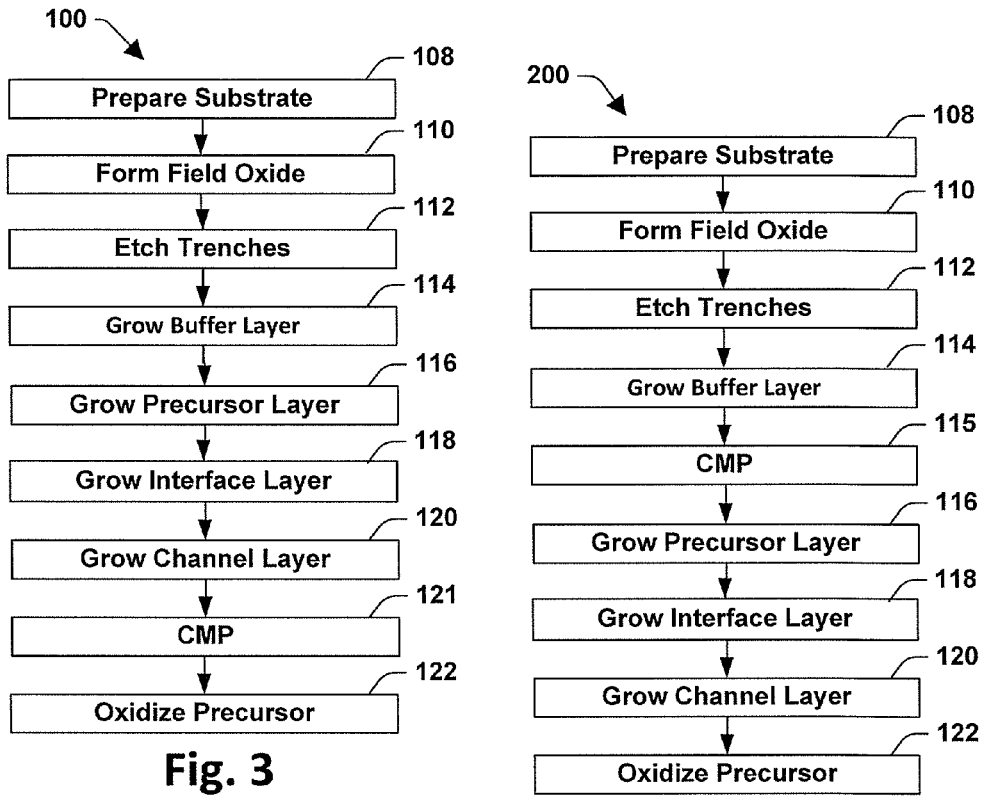
Fig. 3
Fig. 4
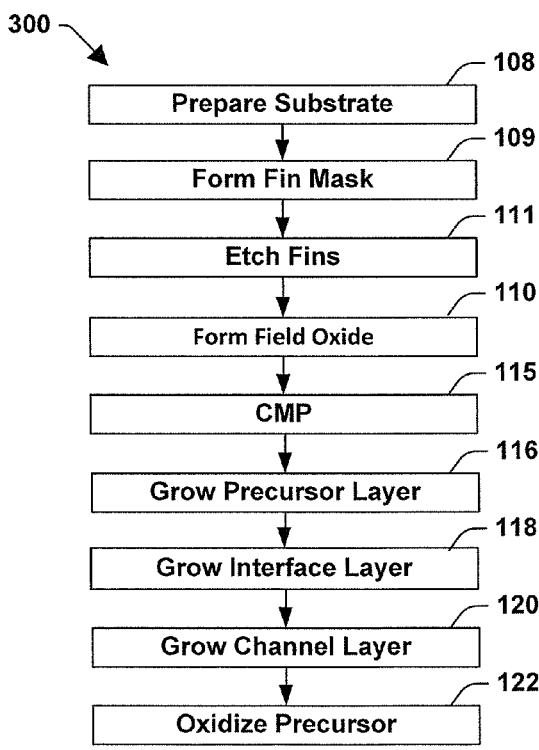
Fig. 5

BARRIER LAYER FOR FINFET CHANNELS

FIELD OF THE INVENTION

The present disclosure relates to FinFETs for integrated circuit devices and methods of manufacturing them.

BACKGROUND

The semiconductor industry's drive for higher device densities, better device performance, and lower cost has led to the development of integrated circuit transistors that are three-dimensional in the sense of making greater use of space perpendicular to the substrate surface. One such transistor is the FinFET. A FinFET is a field effect transistor (FET) having a channel formed in a fin-like structure of semiconductor extending from a substrate surface. This geometry allows one or more gates to wrap around the channel and/or act on the channel from its sides. This improves control over the channel and reduces short channel effects in comparison to a more conventional structure in which a single plane separates the channel from its gate. The fin-like structure also allows the channel to be extended vertically, increasing its cross-sectional area and permitting a higher current without increasing the transistor's footprint.

Further improvements include replacing the usual silicon channel material with a high mobility semiconductor. High mobility semiconductors generally have a smaller bandgap and higher dielectric constant than silicon. Candidate materials include compound semiconductors, e.g., compounds of Group III and Group V semiconductors. Electrostatic control is reduced when high mobility semiconductors are used. Implant doping to create isolation wells is also more difficult when high mobility semiconductors are used.

BRIEF DESCRIPTION OF THE DRAWINGS

FIG. 3 is a flow chart of an example process provided by the present disclosure.

FIG. 4 is a flow chart of another example process provided by the present disclosure.

FIG. 5 is a flow chart of still another example process provided by the present disclosure.

DETAILED DESCRIPTION

The present disclosure provides integrated circuit devices having FinFETs with channel regions low in crystal defects and a current-blocking layer underneath the channels to improve electrostatic control. Optionally, an interface control layer formed of a high bandgap semiconductor is formed between the current-blocking layer and the channel. The disclosure also provides methods of forming integrated circuit devices having these structures. The methods include forming a FinFET fin including a channel layer by epitaxial growth, then oxidizing a portion of the fin to form a current-blocking layer.

Figure 1:
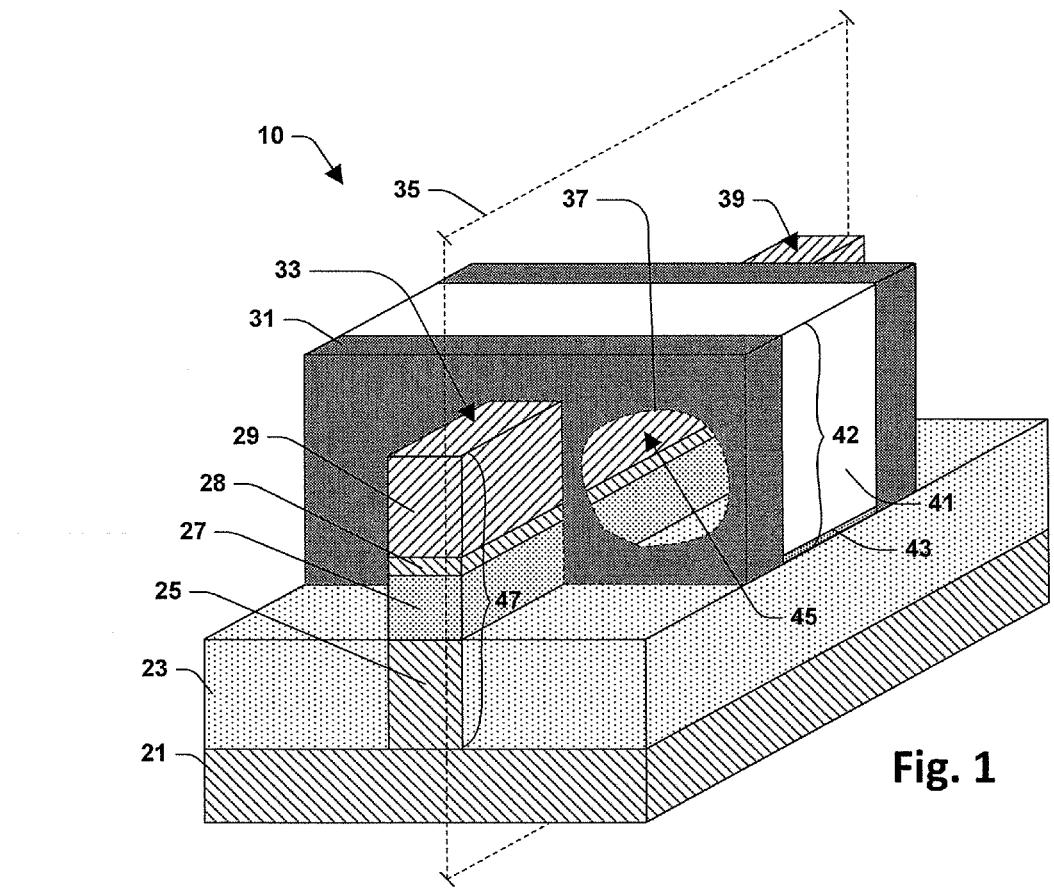
FIG. 1 illustrates an example FinFET provided by the present disclosure.
Figure 2:
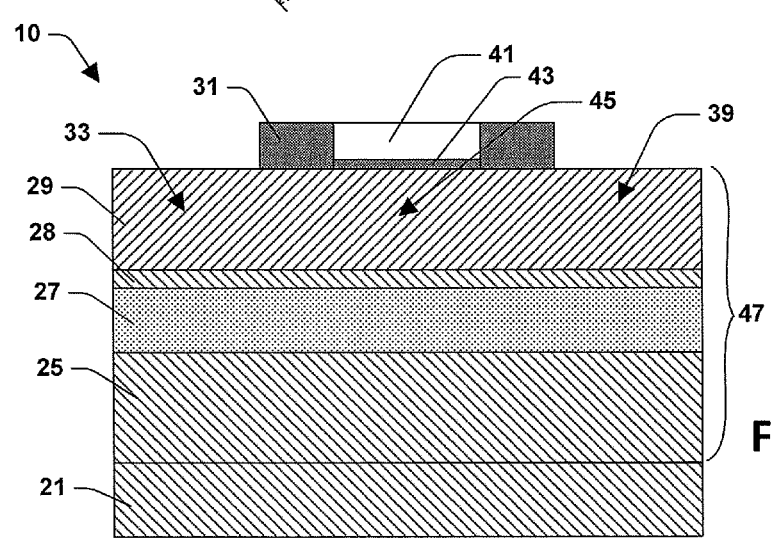
FIG. 2 is a view of a cross section of the example shown in FIG. 1 taken along the plane 35.

FIG. 1 provides a perspective view of a FinFET 10 forming part of an integrated circuit device provided by the present disclosure. The FinFET 10 includes a semiconductor fin 47 on a semiconductor body 21. The fin 47 includes a source region 33 at one end, a drain region 39 at the other end, and a channel region 45 in between. These regions are formed in a channel layer 29 of the fin 47. A gate 42 wraps around the channel region 45. FIG. 1 includes a cutaway 37 in which the gate 42 and the spacer 31 have been removed from the view to reveal part of the channel region 45 of the fin 47. Part of the field oxide 23 and optional epitaxial growths in the source and drain region 33 and 39 are also excluded from the view to provide clarity in FIG. 1. The gate 42 includes a dielectric layer 43 and a conductive layer 41. Spacers 31 are formed to either side of the gate 42. FIG. 2 provides a cross-sectional view of FinFET 10 taken along the plane 35 of FIG. 1. The sizes of features are not shown to scale.

The fin 47 includes multiple layers of various materials. The lower layer is an optional buffer layer 25. The next layer is a current-blocking layer 27. Over the current-blocking layer 27 is an optional interface control layer 28. The uppermost layer is a channel layer 29 in which the channel 45 is formed. The FinFET 10 can be of the n-type or the p-type and the various layers of the fin 47 can be n-doped or p-doped as required.

The semiconductor body 21 can have any suitable composition. Examples of suitable compositions include, without limitation, Si, SiGe, Ge, InP, InGaAs, InAs, and GaSb. The semiconductor body 21 can have any suitable substrate. A suitable substrate can be, for example, a single crystal semiconductor wafer or semiconductor on insulator (SOI) structure.

The buffer layer 25 is an optional layer. In some embodiments, the material of the buffer layer 25 is chosen to provide it with a low susceptibility to oxidation in comparison to the precursor of the current-blocking layer 27. The material for the buffer layer 25 can be chosen for the ease with which it can be epitaxially grown from the semiconductor body 21 with a low defect rate in its crystal structure. Examples of semiconductors that can be suitable for the buffer layer 25 include, without limitation, Si, SiGe, Ge, InP, InGaAs, InAs, and GaSb. The buffer layer 25 can be contiguous with the semiconductor body 21. In some embodiments, the buffer layer 25 begins as part of the semiconductor body 21, with the regions of the semiconductor body 21 to either side of the buffer layer 25 being removed by etching with the fin 47 protected by a mask. A suitable thickness for the buffer layer 25 is typically in the range from 20 nm to 300 nm.

A low susceptibility to oxidation can result from a low chemical susceptibility to oxidation. More typically, however, a low susceptibility to oxidation is the product of a material's propensity to form a diffusion barrier layer upon oxidation. Oxidation of such a material is self-limiting. Upon exposure to an oxidant, a thin layer of oxide forms on the outer surface. The oxide layer prevents diffusion of oxygen-bearing species to the interior, protecting the interior from oxidation. Thus, while the outer surface may oxidize readily, the layer as a whole is said to have a low susceptibility to oxidation.

The current-blocking layer 27 is an oxidation product of a precursor previously occupying the same location. The precursor layer (see 27A of FIGS. 8-9) is provided as a semiconductor from which the interface control layer 28, where provided, and the channel layer 29 can be formed by epitaxial growth, whereby those layers can have crystalline structures with low defect rates. In some embodiments, the precursor to the current-blocking layer 27 is a semiconductor that has a high susceptibility to oxidation as compared to other layers of the fin 47. The precursor can also be selected to lattice match with the adjacent layers above and below. A suitable material for the precursor can be an aluminum compound such as Al(Ga)P, Al(Ga)As, InAlAs, Al(Ga)Sb, or Al(Ga)AsSb. These materials do not exhibit self-limiting oxidation on the scale of the fin 47. The precursor layer is formed by epitaxial growth and later oxidized in situ to form current-blocking layer 27. In most embodiments, the precursor layer is oxidized along the entire length of the fin 47 to maximize electrical isolation of the channel 45 from the semiconductor body 23. In some other embodiments, the precursor layer is oxidized only under the channel region 45. The current-blocking layer 27 is functional to electrically isolate the channel 45 from the semiconductor body 23. The thickness of the current-blocking layer 27 is typically in the range from 2 nm to 50 nm.

The interface control layer 28, where provided, is disposed between the current-blocking layer 27 and the channel layer 29. Interfaces with the current-blocking layer 27 can have a high defect concentration following oxidation. If the adjacent layer has a small bandgap, this can result in an undesirable accumulation of charge carriers. The interface control layer 28 can be provided to passivate an interface with the current-blocking layer 27. This function is enhanced when the interface control layer 28 is formed of a material having a large bandgap. This function is also enhanced when the interface control layer 28 is formed of a material that forms a low defectivity interface with the oxidized layer. Other desirable properties include a low susceptibility to oxidation and a good lattice match with the precursor to the current-blocking layer 27 and with the material of the channel layer 29. In some embodiments, a good lattice match with the channel layer 29 is a mismatch less than 0.5%. In some other embodiments, however, a lattice mismatch with the channel layer 29 is desirable to induce strain and a lattice mismatch of about 4% or more is "good". Examples of materials that can be suitable for the interface control layer 28 include, without limitation, InP, GaAS, Si, and SiGe. The thickness of the interface control layer 28, when provided, is typically in the range from 0.5 nm to 5 nm.

The channel layer 29 provides the channel 45 for the FinFET 10. The channel layer 29 can be formed of any suitable semiconductor. Examples of suitable materials include Si, SiGe, Ge, and other Group IV semiconductors and semiconductor compounds. In some embodiments, the channel layer 29 is formed of a high mobility semiconductor. Examples of high mobility semiconductors include compounds of Group III (Group 13 in modern IUAPC notation) and Group V (Group 15 in modern IUAPC notation) elements. Examples of such compounds include, without limitation, InAs, InGaAs, InSb, InAsSb, and InGaSb. The thickness of the channel layer 29 is typically in the range from 5 nm to 30 nm. The FinFET 10 can be formed by any suitable process.

FIG. 3 provides a flow chart of an example process 100 that can be used to form an integrated circuit device including the FinFET 10. The first act 108 in process 100 is providing and preparing the semiconductor body 21. Preparing the semiconductor body 21 can include doping to provide separate n-doped nMOS regions and p-doped pMOS regions of the semiconductor body 21.

Figure 7:
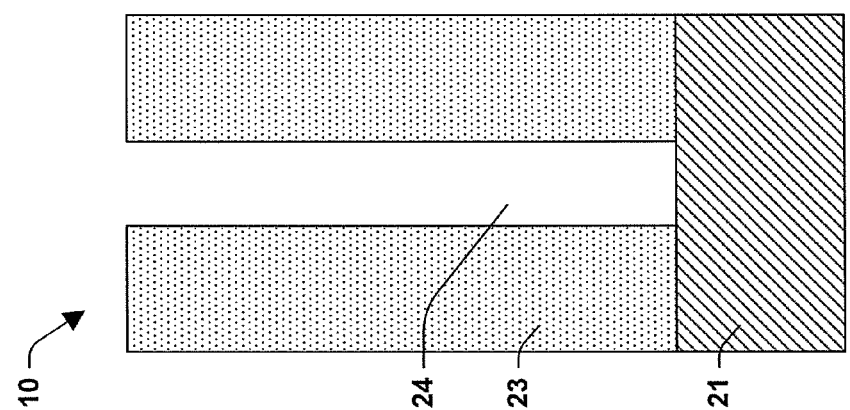
Figure 6:
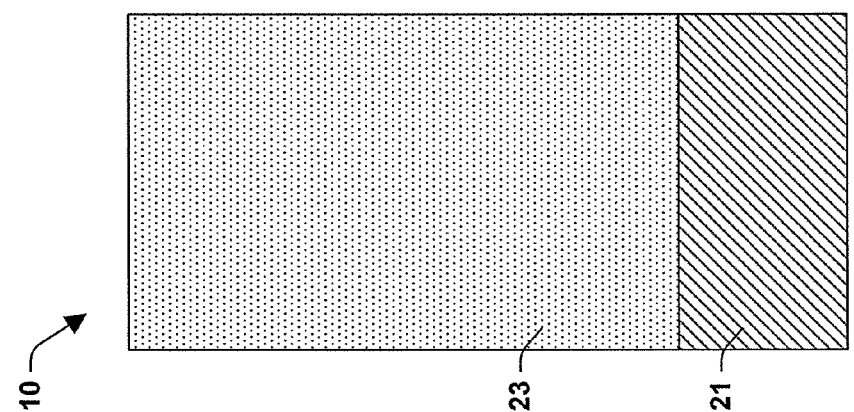

Act 112 etches trenches 24 in field oxide 23 as illustrated by FIG. 7. The trenches 24 are located where fins 47 are desired. The trenches 24 can be formed by any suitable process. A typical process includes photolithography to form a patterned mask, etching the field oxide 23 where it is exposed through the mask to form the trenches 24, then stripping the mask.

Figure 8:
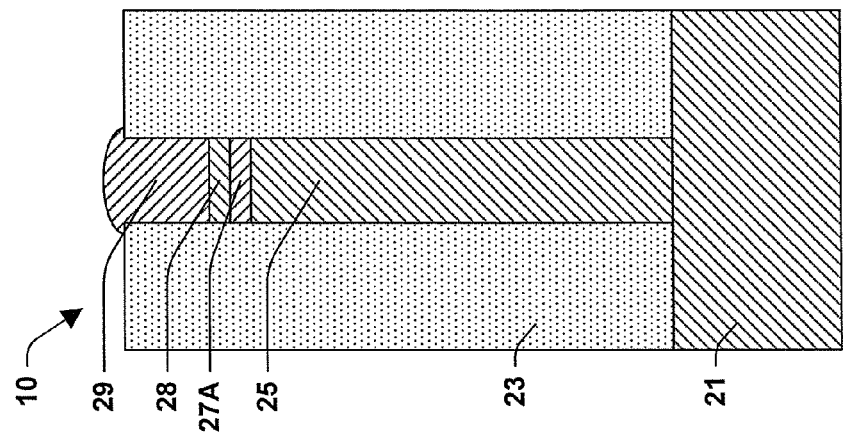
FIGS. 6-15 illustrate an example FinFET as it undergoes manufacture by the example processes.

Acts 114 through 120 form the various layers of the fin 47. Act 114 forms the buffer layer 25, act 116 forms the precursor 27A to the current-blocking layer 27, act 118 forms the interface control layer 28, and act 120 forms the channel layer 29. Each layer is formed by epitaxial growth from the underlying layer in one embodiment, whereby each layer has a high quality crystalline structure exhibiting few defects. The resulting structure is illustrated by FIG. 8.

Figure 10:
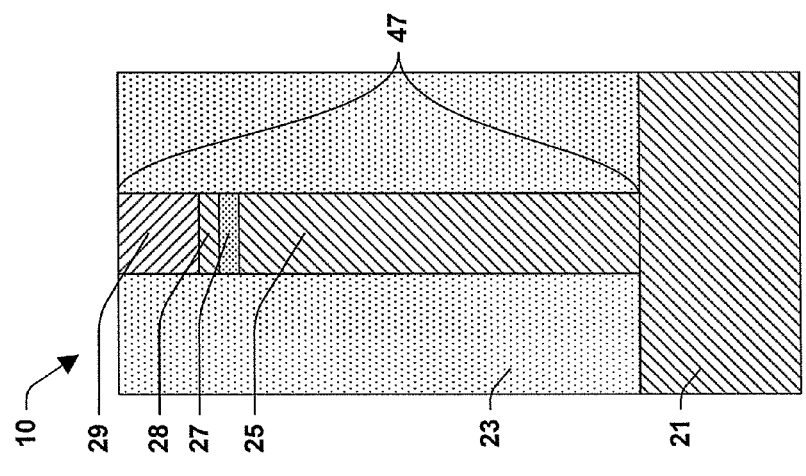
Figure 9:
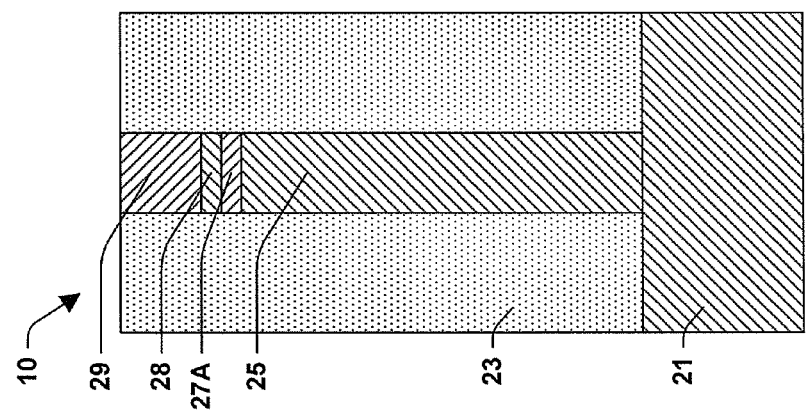

Act 121 is chemical mechanical polishing or another planarization process to form the structure illustrated by FIG. 9. The precursor layer 27A is oxidized by Act 122, converting the precursor layer 27A to the current-blocking layer 27 and providing a structure as illustrated by FIG. 10.

Figure 12:
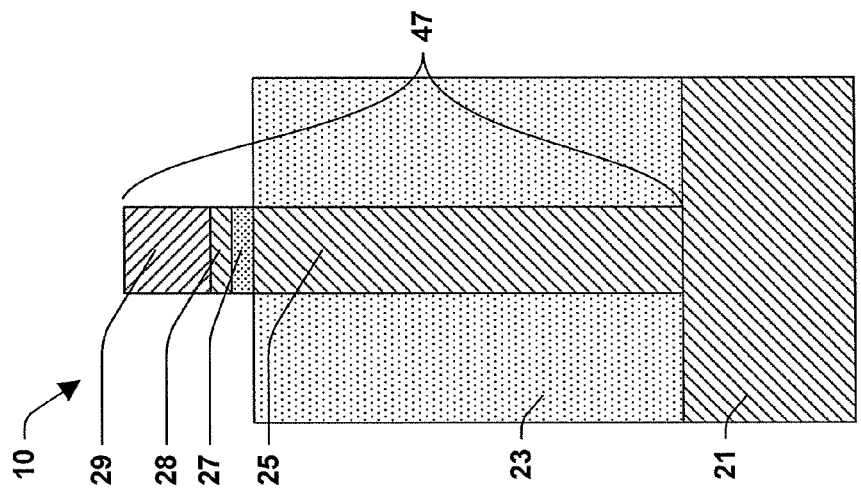
Figure 11:
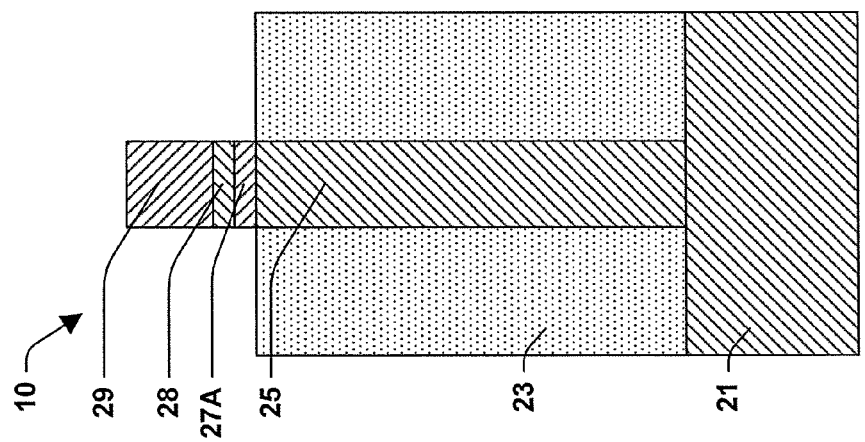

The precursor layer 27A can be oxidized by any suitable process. The process can be carried out in any suitable tools. Examples of tools that can be used include a rapid thermal annealing tool, a furnace, a vacuum processing chamber, an atomic layer deposition tool, and an ion implanter. The source of oxygen can be, for example, oxygen gas, air, ozone, oxygen plasma, gaseous oxygen radicals, water vapor, or atomic oxygen drawn from field oxide 23.

Where the source of oxygen is other than field oxide 23, it may be desirable to etch back the field oxide 23 as shown in FIG. 11, exposing the oxide precursor layer 27A and making that layer more susceptible to oxidation. Act 122, oxidizing the precursor 27A, then produces the structure shown in FIG. 12.

Act 122 oxidizes the precursor layer 27A through the full thickness of the fin 47, electrically isolating the channel layer 29 from the semiconductor body 21. Act 122 may also partially oxidize one or more other layers of fin 47. Such partial oxidation of a fin layer other than layer 27A is limited to a thin region on the outer surface of fin 47.

Figure 15:
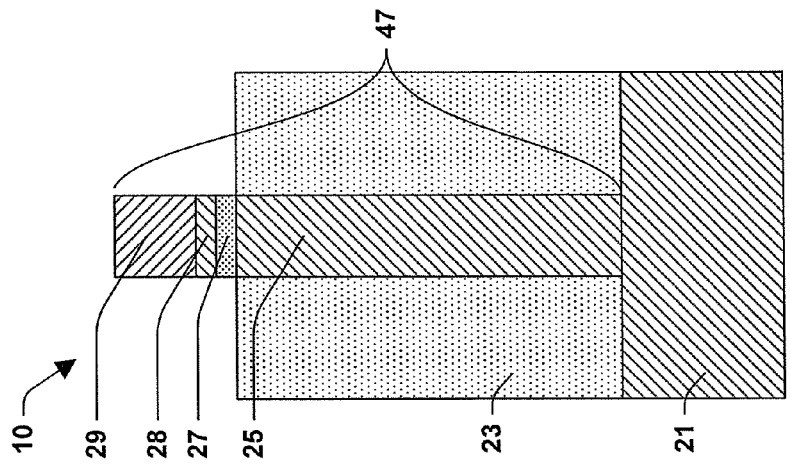
Figure 14:
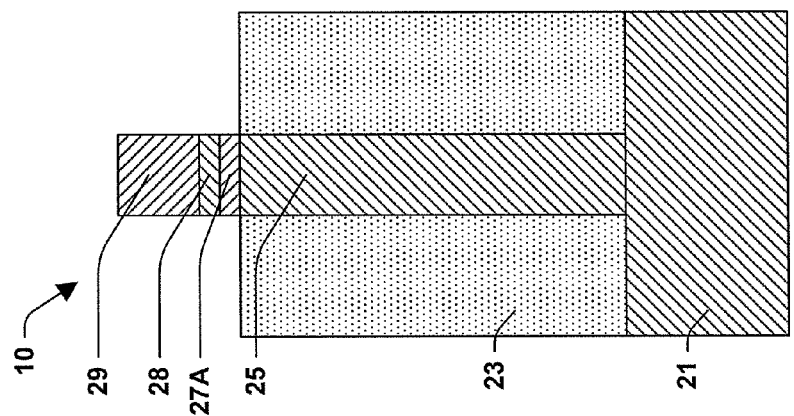

FIG. 4 illustrates an alternate process 200 that is in most ways similar to the embodiment of process 100. The main difference is the act of chemical mechanical polishing 115 following act 114, growing the buffer layer 25. This produces a structure such as the one illustrated by FIG. 13. The additional fin layers are then grown to produce a structure as illustrated by FIG. 14. Oxidation 122 then produces a structure as illustrated by FIG. 15. Embodiments in which chemical mechanical polishing 115 is carried out prior to forming the upper layers of the fin 47 have the advantage of providing greater planarity to the upper layers and better control over their thickness.

Figure 13:
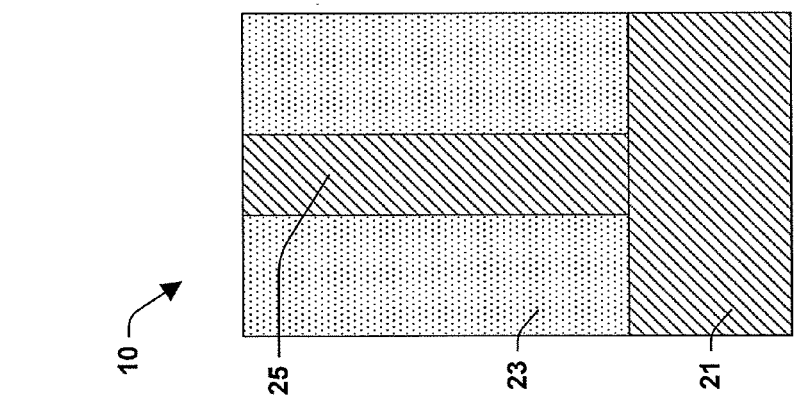

It will be appreciated that the structures of FIG. 9 and FIG. 13 can be achieved by alternate process sequences in which one or more of the buffer layer 25, the precursor layer 27A, the interface control layer 28, and the channel layer 29 are formed prior to act 110, forming the field oxide 23. FIG. 5 provides a flow chart for an example process 300 illustrating these alternate embodiments. In these alternate embodiments, the layers formed prior to field oxide 23 are etched back to either side of the fin 47. In the process 300, the buffer layer 25 begins as part of the semiconductor body 21. In act 109, a mask is formed to cover the locations where fins are desired (the negative of the mask used by act 112. Act 111 is etching by which the form of fins 47 emerge from the semiconductor body 21. Field oxide layer 23 is then formed by act 110. Chemical mechanical polishing 115 again produces the structure shown in FIG. 13. The process 300 then continues as previously described with respect to processes 100 and 200.

Current-blocking layer 27 is provided to electrically isolate the channel 45 from the semiconductor body 21, however, the channel 45 is only a fraction of the channel layer 29. In some embodiments, the channel 45 can be electrically isolated at either end by doping to form the source region 33 and the drain region 39. Therefore, in some embodiments the current-blocking layer 27 is not required along the entire length of the channel layer 29, but only underneath that portion of the channel layer 29 in which the channel 45 is formed. In some embodiments, the current-blocking layer 27 is formed under the channel 45, but not underneath the source region 33 or the drain region 39. One the other hand, depending on the respective dopings of the source region 33, the drain region 39, and the channel region 45, the source region 33 and the drain region 39 interfaces with the channel region 45 may not be current-blocking. Also, in some embodiments, an interface of the buffer layer 25 with the source region 33 or the drain region 39 would be conductive. Therefore, in most embodiments, the current-blocking layer 27 extends into the source region 33 and the drain region 39. In most embodiments, the current-blocking layer 27 is formed underneath channel layer 29 throughout the fin 47.

Figure 16:
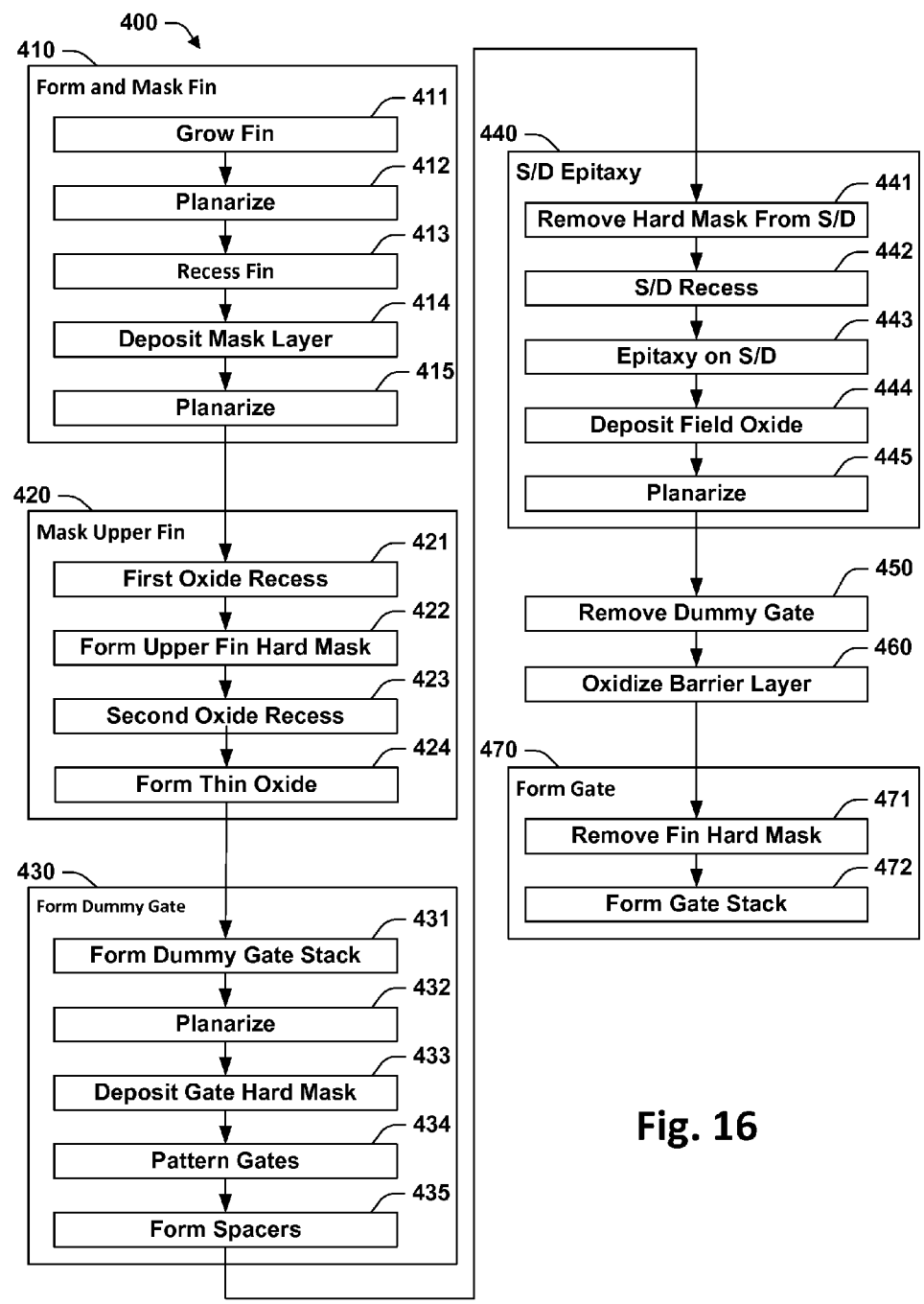
FIG. 16 is a flow chart of another example process provided by the present disclosure.

FIG. 16 provides a flow chart for an example replacement gate process 400 that forms a FinFET 20 of FIGS. 17-36, in which a current-blocking layer 27 is provided under the channel 45, but not underneath the source region 33 or the drain region 39. The process 400 also provides an example of alternate embodiments in which portions of the fin 47 are masked during oxidation of the precursor layer 27A, whereby other layers of the fin 47 are not required to have a low susceptibility to oxidation.

Figure 17:
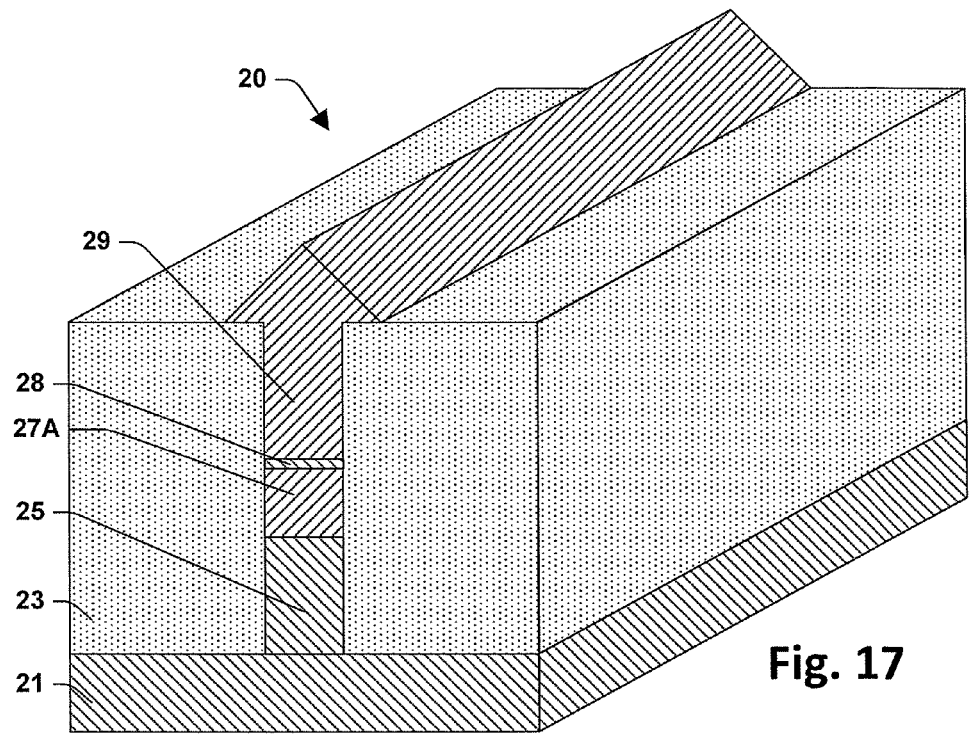
FIGS. 17-30 provide perspective views of another example FinFET as it undergoes manufacture.
Figure 18:
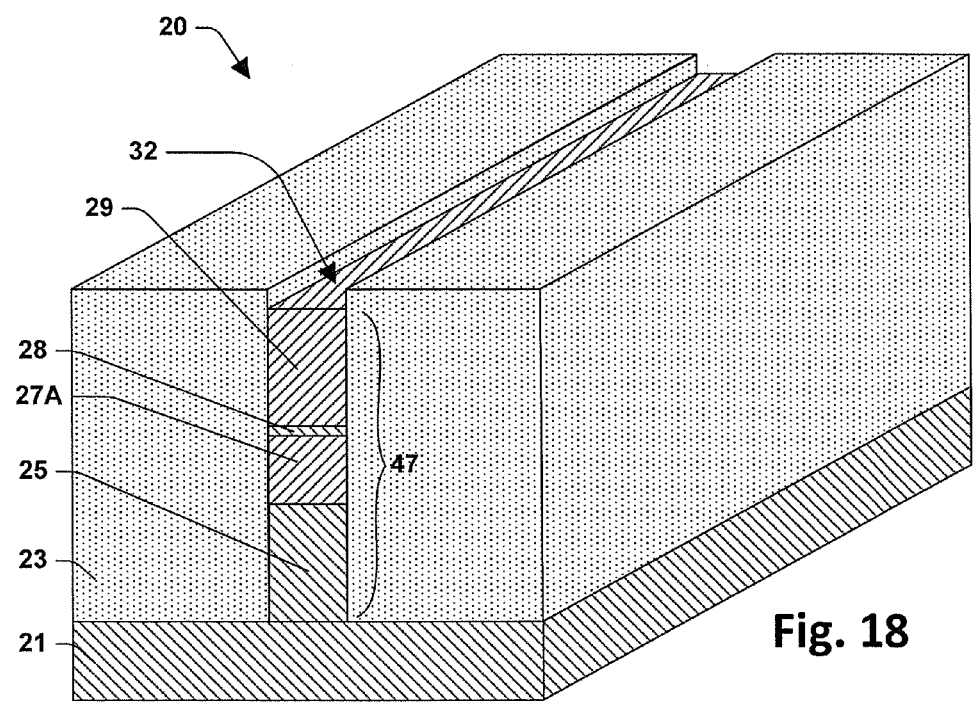
Figure 19:
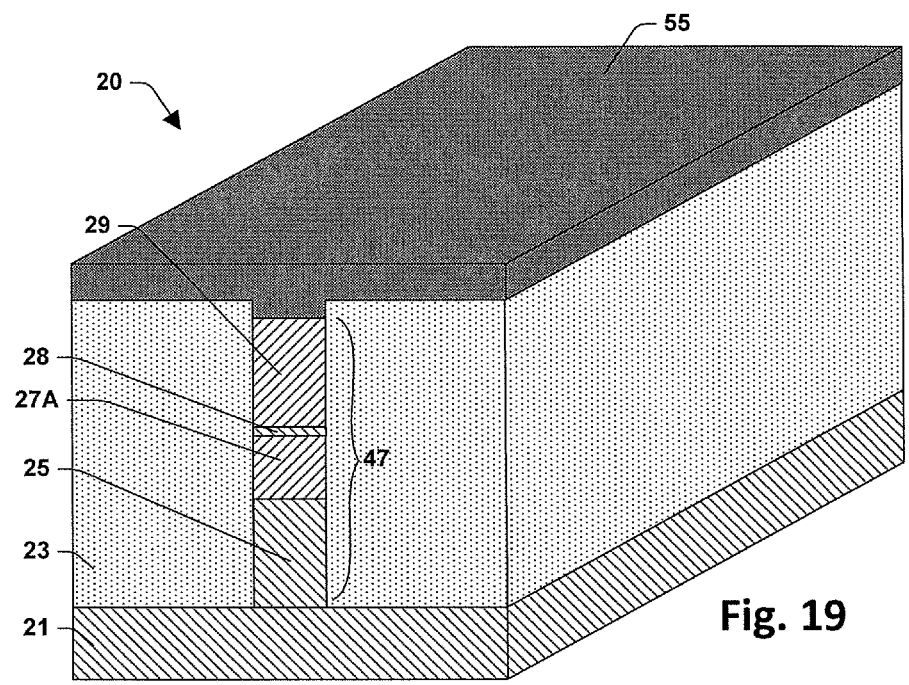
Figure 20:
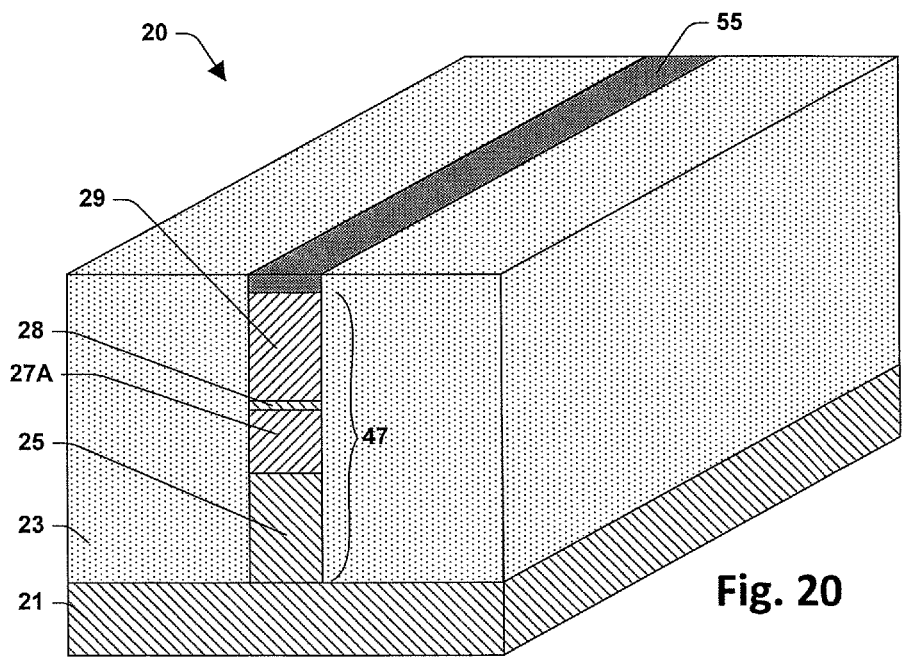

Process 400 begins with a series of acts 410 that form a fin 47 covered on top by a hard mask 55. Act 411 is epitaxially growing the various layers of the fin 47 as previously described. FIG. 17 provides an example where the process is similar to process 100 and the resulting structure is similar to the one shown in FIG. 8. Act 412 planarizes the fin 47 with field oxide 23. Act 413 forms a slight recess 32 at the location of the fin 47 as shown in FIG. 18. A hard mask layer 55 as shown in FIG. 19 is then formed by act 414. Act 415 is planarization to remove the hard mask layer 55 except where it fills the recess 32. The resulting structure is shown in FIG. 20.

Figure 21:
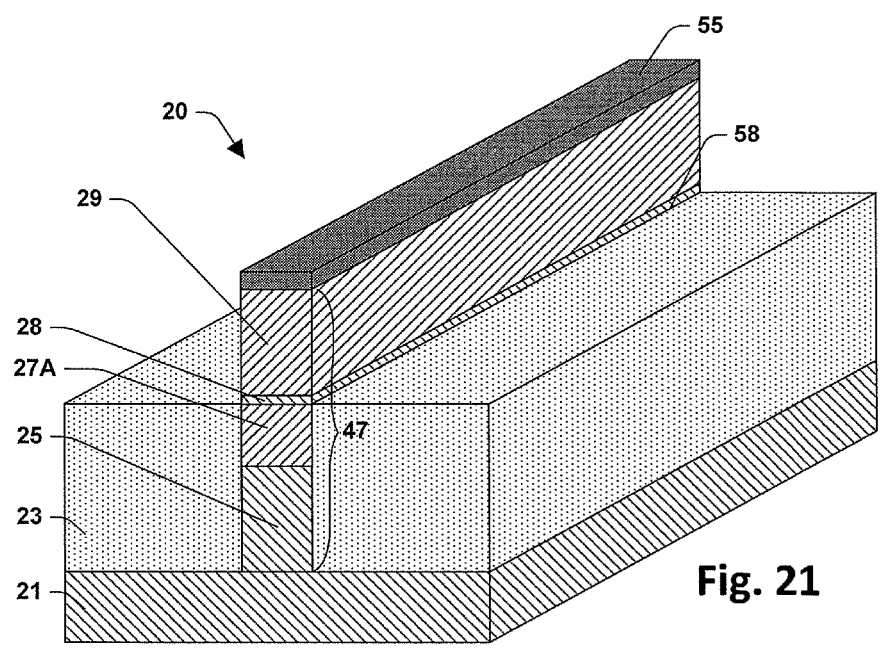

The process 400 continues with a series of acts 420 that form a mask 56 over an upper portion of the fin 47. Act 421 is an etch that recesses the field oxide 23 to below the base of the channel layer 29. Where an interface control layer 28 is provided, the field oxide 23 is recessed to where its upper surface aligns with that layer. FIG. 21 provides an example in which the field oxide is recessed to align with the base 58 of the interface control layer 28.

Figure 22:
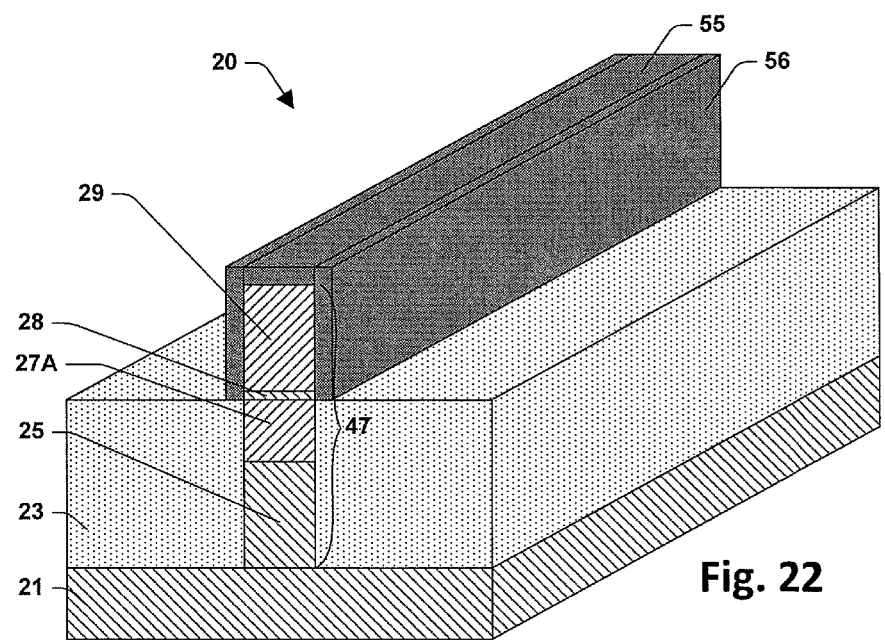
Figure 23:
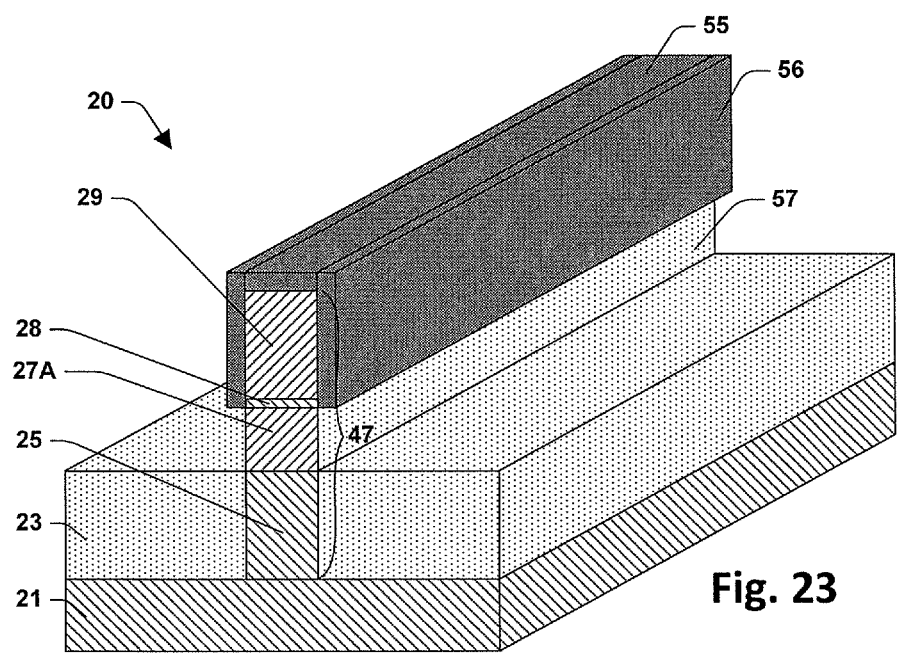
Figure 24:
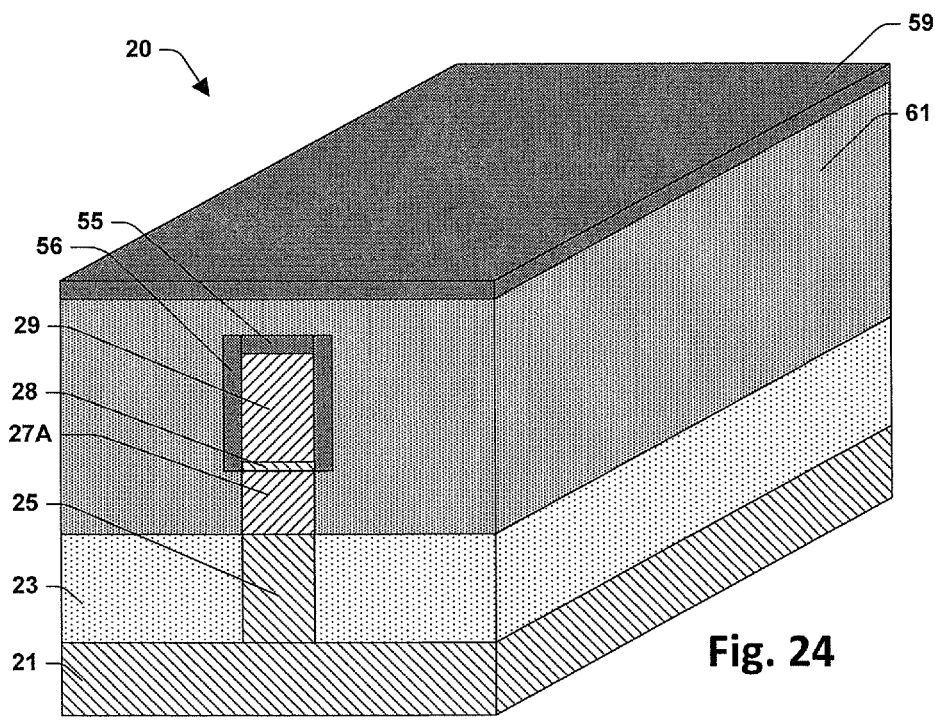
Figure 25:
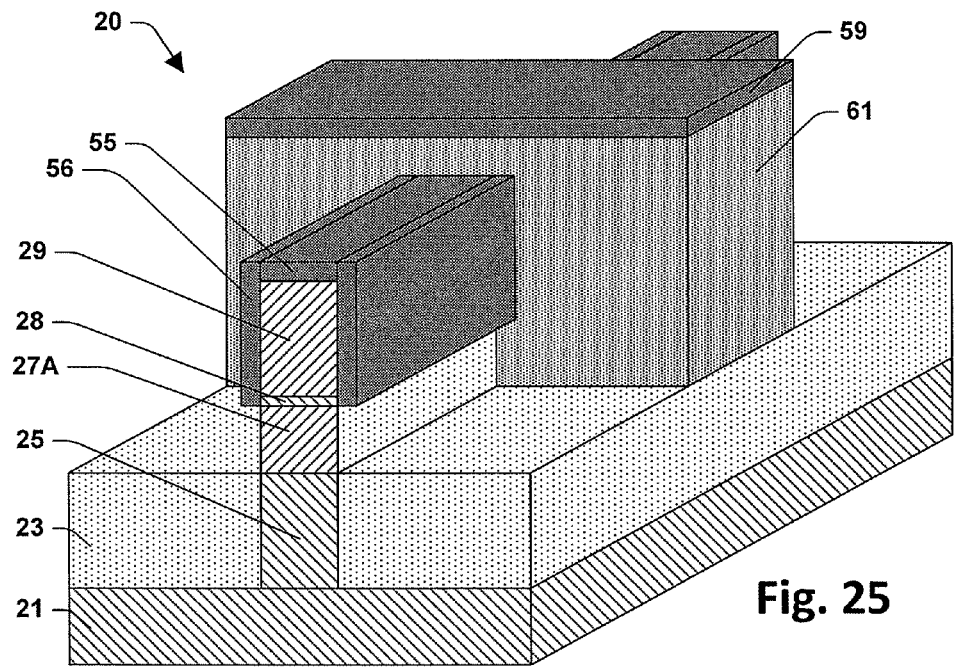

Act 422 forms a mask 56 covering the sides of the exposed portion of fin 47 as shown in FIG. 22. The mask 56 can be formed by any suitable process. A suitable process can be one otherwise used to form spacers, for example a blanket deposition of the spacer material followed by anisotropic etching. The mask 56 can have any suitable composition, but is typically a nitride, SiON for example. After forming the mask 56, act 423 further recesses the field oxide 23 as shown in FIG. 23, exposing the portion of the fin 47 in which the current-blocking layer 27 is desired. Because the location where the current blocking layer 27 is desired is the only portion of the fin 47 that is exposed, process 400 allows the precursor layer 27A to have the same composition as the buffer layer 25 and to even originate as part of the semiconductor body 21 where all or part of the fin 47 is formed by etching back the substrate as in process 300.

Act 424 forms a thin oxide layer 57 over the exposed portions of the fin 47, which is also shown in FIG. 23. Thin oxide layer 57 protects the fin 47, such as by providing an etch stop layer for when a dummy gate is later removed in a gate replacement process.

The process 400 continues with a series of acts 430 that form a dummy gate 61 over the channel region 45 of the fin 47. Act 431 is forming a dummy gate stack. The dummy gate stack includes sacrificial material and optionally one or more additional layers. The additional layers can include interfacial layers, etch stop layers, and or dielectric layers. The sacrificial material is typically polysilicon, but any suitable material can be used. Act 432 planarizes the dummy gate stack 61 and act 433 forms a mask layer 59 over the dummy gate stack 61 to provide the structure shown in FIG. 24. Act 434 patterns the dummy gate stack 61 to form the structure shown in FIG. 25.

Figure 26:
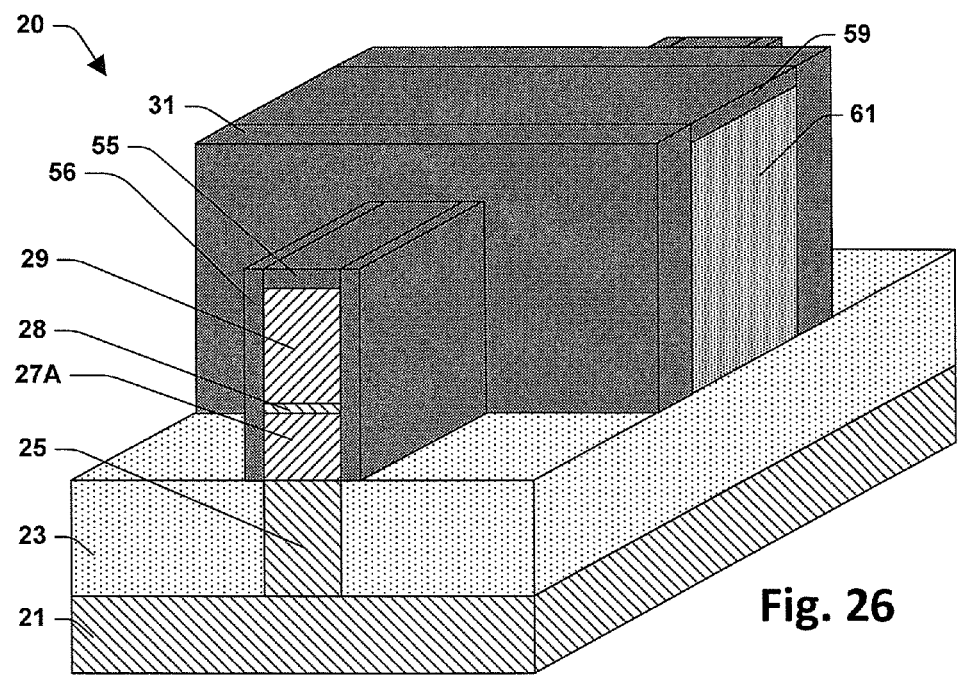

Act 435 forms spacers 31 as shown in FIG. 26. Any suitable spacer formation process can be used. The materials of mask 56 and spacers 31 can be selected to allow the spacer material to be etched anisotropically without substantially removing the masks 55 and 56. Alternatively, the masks 55 and 56 can be removed by the spacer formation process 435. The spacer formation process 435 can alternatively be allowed to extend the mask 56 to cover the sides of precursor layer 27A in source area 33 and drain area 39 to produce a structure as shown in FIG. 26.

Figure 27:
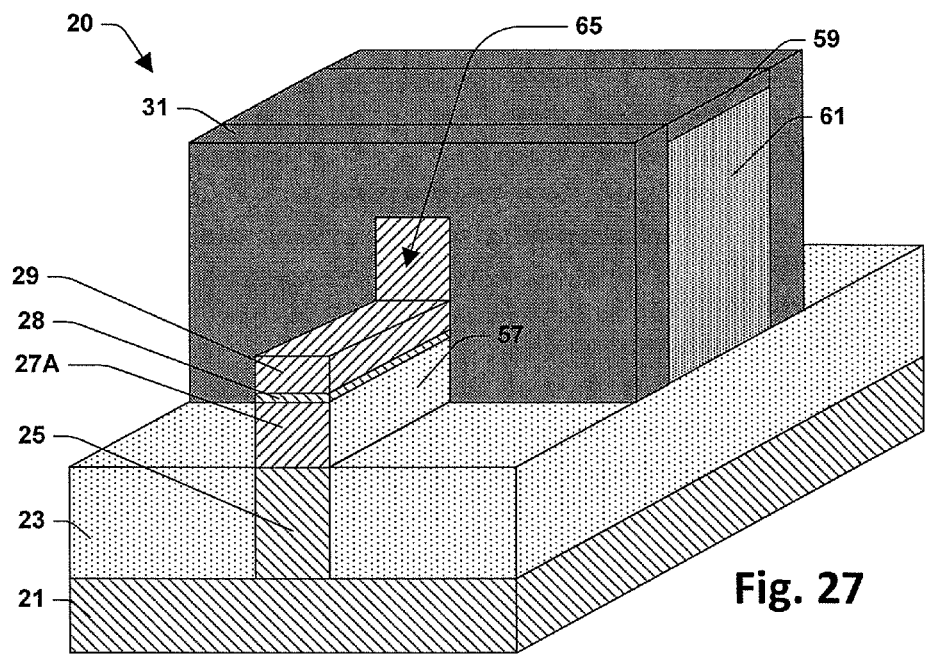

The process 400 continues with a series of acts 440 that increase the area available for source and drain contacts through epitaxial growth. Act 441 removes the hard mask 55 and 56 from the source region 33 and the drain region 39 of the fin 48 as shown in FIG. 27. Act 442 is an optional step that is included when it is desired for the epitaxial growth to place stress on the channel region 45. Act 442 creates recesses 65 within the fin 47 in the source region 33 and the drain region 39 as shown in FIG. 27.

Figure 28:
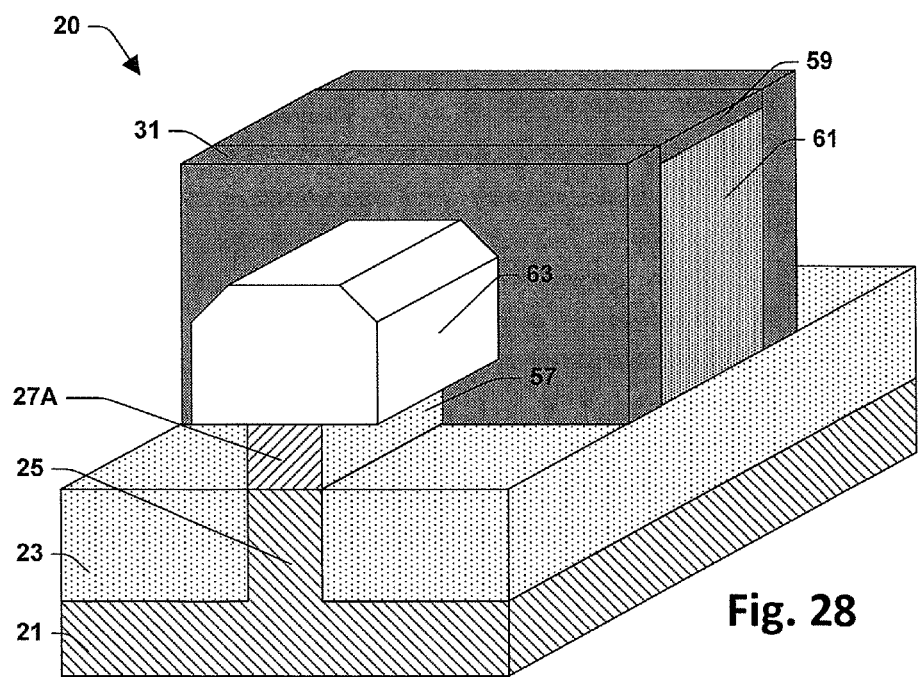

Act 443 is epitaxial growth of a semiconductor 63 on the source regions 33 and the drain regions 39 to provide a structure as shown in FIG. 28. Where the recesses 65 have been formed, the semiconductor 63 is generally selected to have a larger or smaller lattice constant than the semiconductor of the channel region 45 according to whether the FinFET 20 is of the nMOS or pMOS type.

Figure 29:
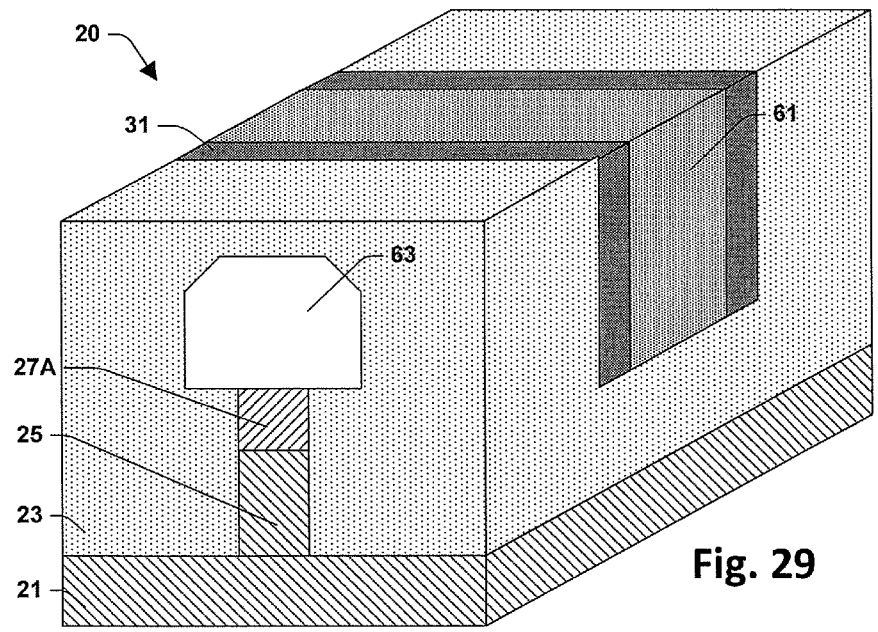
Figure 30:
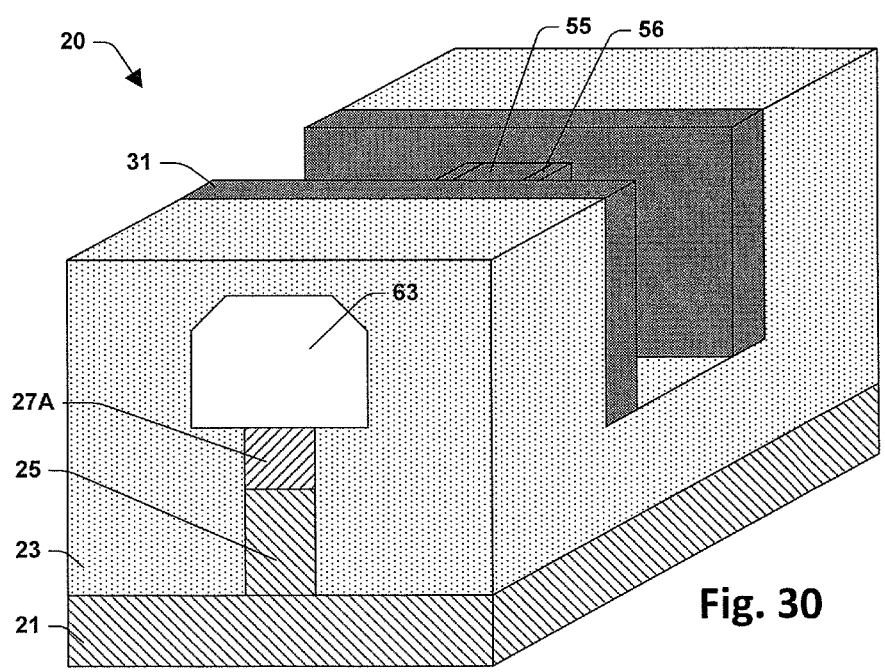
Figure 31:
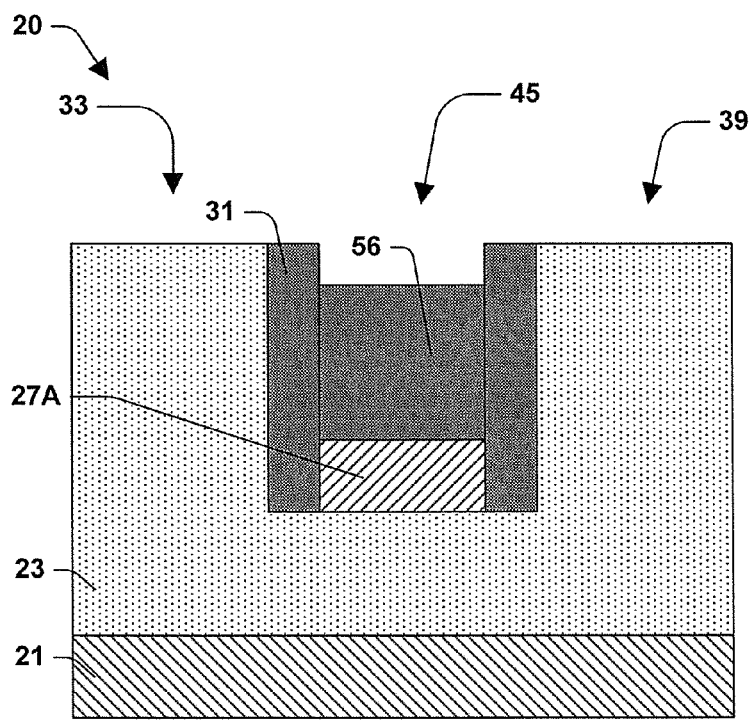
FIGS. 31-34 provide side views of the other example FinFET as it undergoes manufacture.

Act 444 deposits additional field oxide 23. Act 445 is a planarization process that produces a structure as shown in FIG. 29. The additional field oxide 23 provides a level surface for forming mask layers in subsequent steps. The process 400 continues with Act 450, removing the dummy gate stack 61 to produce a structure as shown in FIG. 30. FIG. 31 is a side view of this same structure.

Figure 32:
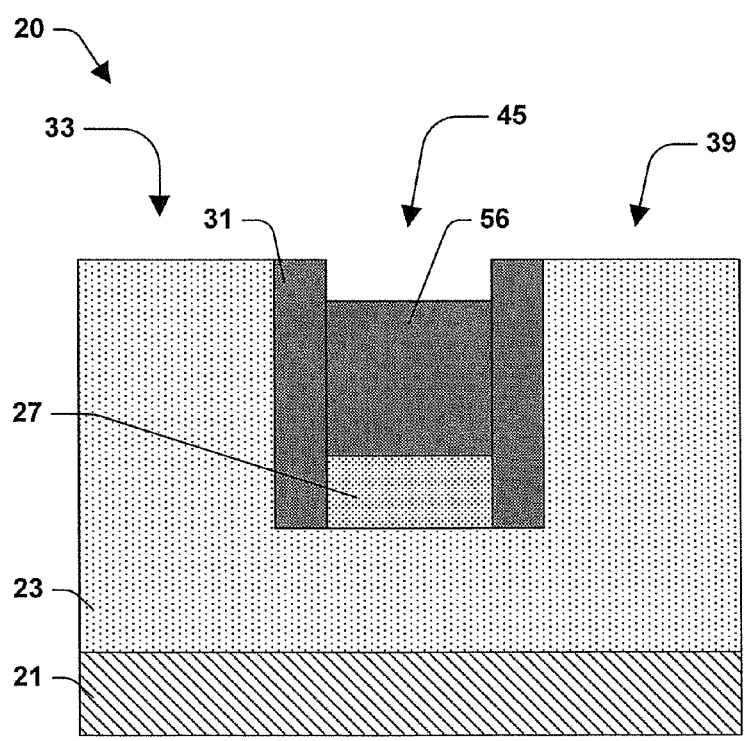

Act 460 is an oxidation process that converts the precursor layer 27A to the current-blocking layer 27 underneath the channel area 45. The process can be any of the ones described with respect to act 122. The resulting structure is illustrated by FIG. 32.

Figure 33:
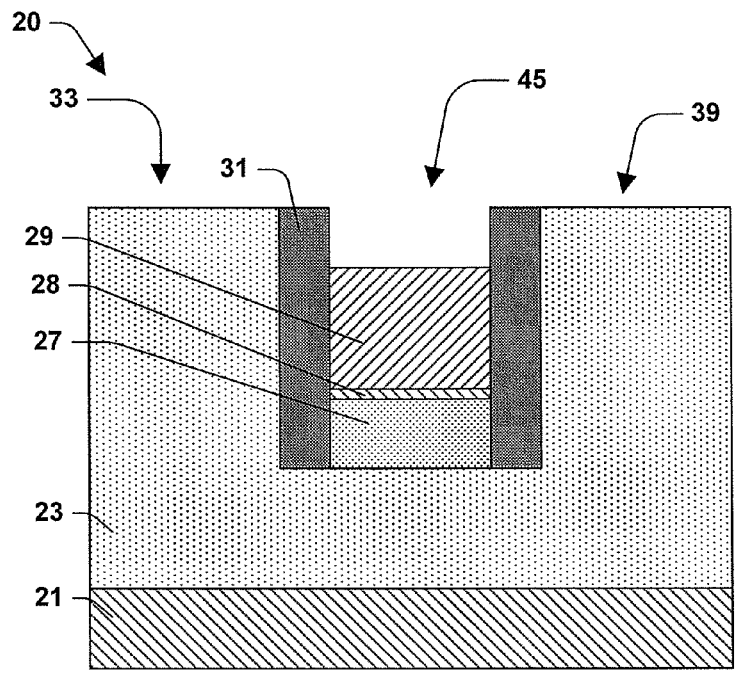
Figure 34:
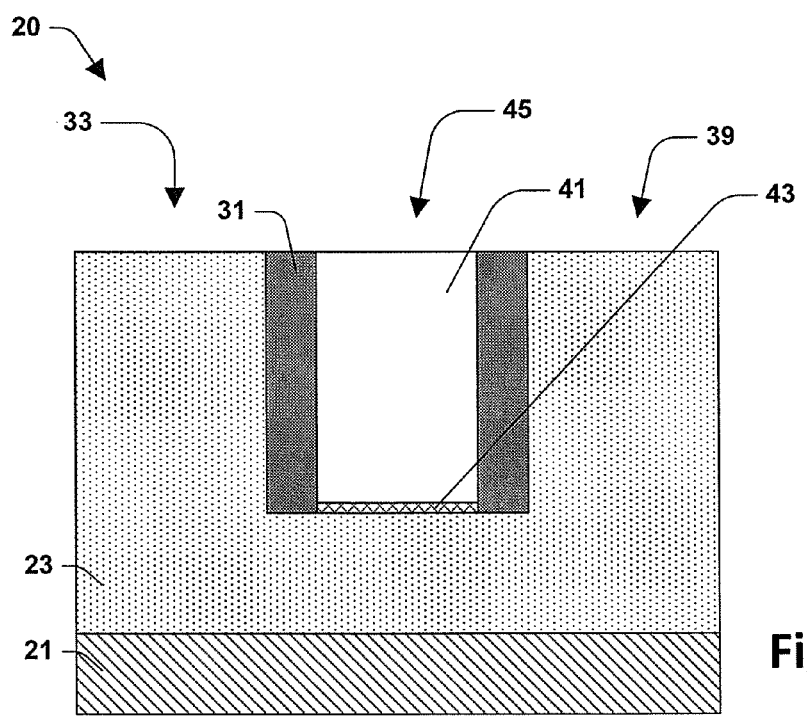
Figure 35:
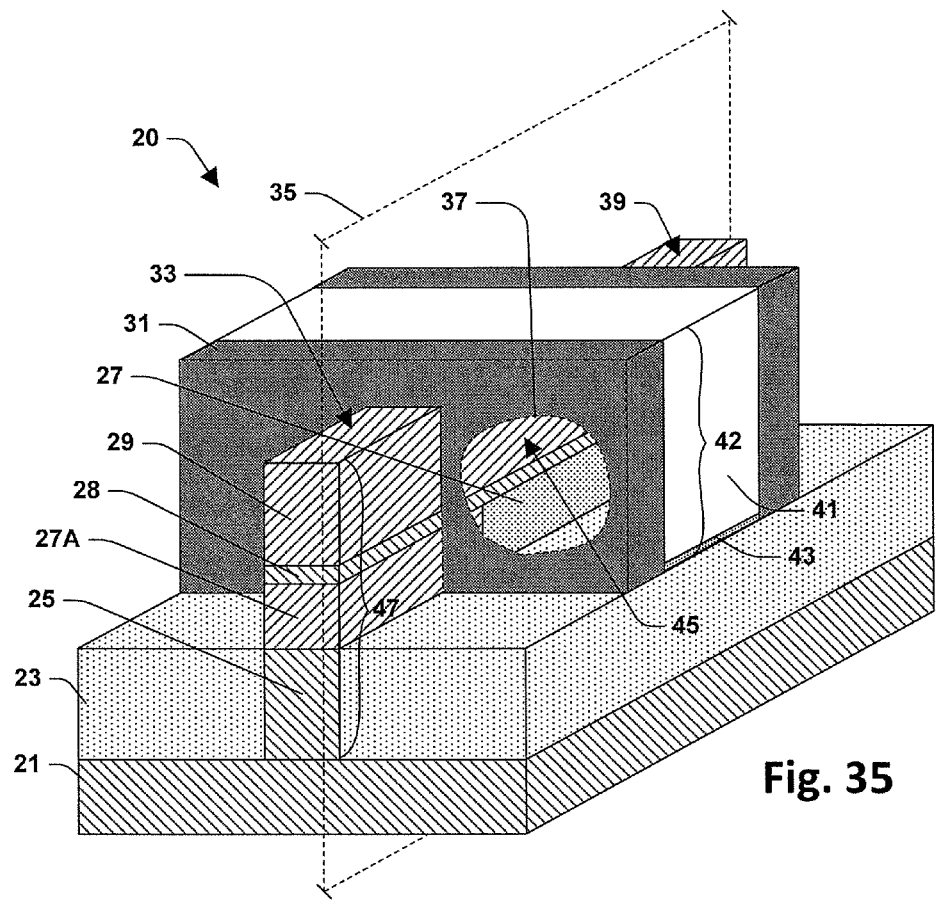
FIG. 35 is a perspective view of the FinFET of FIG. 34.
Figure 36:
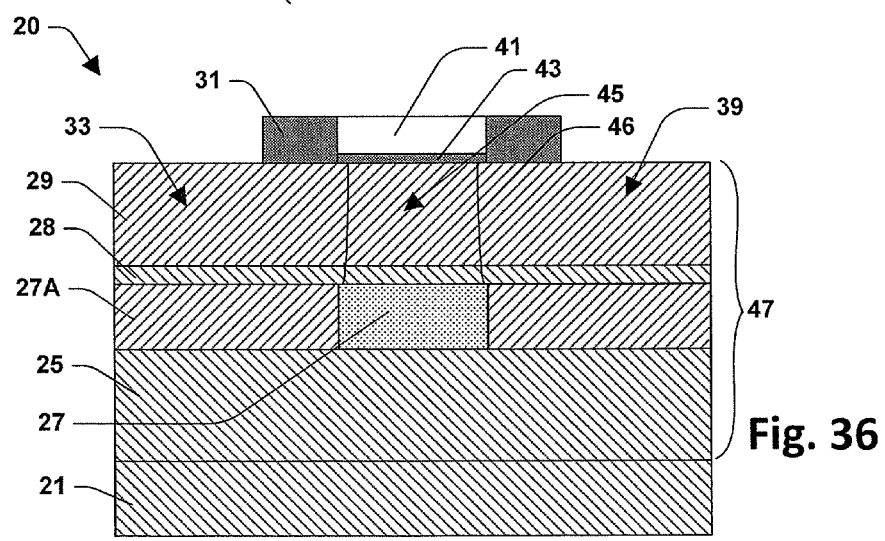
FIG. 36 is a view of a cross section of the example shown in FIG. 35 taken along the plane 35.

The process 400 continues with a series of acts 470 that complete the gate replacement process. Act 471 removes the masks 55 and 56 from the channel region 45 as shown in FIG. 33. Act 472 then forms the replacement gate to produce the structure shown in FIGS. 34-36. FIG. 34 provides a side view, FIG. 35 provides a perspective view, and FIG. 36 provides a cross-sectional view from the side, the cross-section being taken along the plane 35 shown in FIG. 35. FIGS. 35 and 36 omit an upper portion of the field oxide 23 and the epitaxial grown semiconductor 63 to provide a better view of other structures.

FIG. 36 shows the location of p-n junctions 46 between the channel 45 and adjacent source region 33 and drain region 39 to better show how these junctions cooperate with current-blocking layer 27 to electrically isolate the channel 45 from the semiconductor body 21. It should be understood that additional processing generally occurs before, during, and after the illustrated actions of the process 100, 200, 300, and 400 to complete the device formation.

The dielectric layer 43 can be formed of any suitable dielectric and can include multiple layers of different dielectrics. $SiO_2$ can be used. In some embodiments, the dielectric layer 43 is a high-k dielectric layer. A high-k dielectric is one having a permittivity at least two times that of silicon dioxide. Examples of high-k dielectrics include hafnium-based materials such as $HfO_2$, HfSiO, HfSiON, HfTaO, HfTiO, HfZrO, and $HfO_2$—$Al_2O_3$ alloy. Additional examples of high-k dielectrics include, without limitation, $ZrO_2$, $Ta_2O_5$, $Al_2O_3$, $Y_2O_3$, $La_2O_3$, and $SrTiO_3$.

The conductive layer 41 can also be made up of any suitable material and can include multiple layers of different materials. In some embodiments, particularly those in which a high-k dielectric is used, the conductive layer 41 is one or more metal layers. A metal layer 41 generally includes at least one layer of Ti, TiN, TaN, Ta, TaC, TaSiN, W, WN, MoN, and MoON. Additional examples of materials for conductive metal layers include ruthenium, palladium, platinum, cobalt, nickel, hafnium, zirconium, titanium, tantalum, aluminum, and conductive carbides, oxides, and alloys of these metals.

The following claims are for an integrated circuit devices having FinFETs with channel regions low in crystal defects and a current-blocking layer underneath the channels to improve electrostatic control. Optionally, an interface control layer formed of a high bandgap semiconductor is formed between the current-blocking layer and the channel. In some claims, the channel region is required to be formed by epitaxial growth from a single semiconductor crystal. There are also claims for methods of forming integrated circuit devices having these structures. The methods include forming a FinFET fin including a channel by epitaxial growth, then oxidizing a portion of the fin to form a current-blocking layer.

The invention as delineated by the following claims has been shown and/or described in terms of certain concepts, components, and features. While a particular component or feature may have been disclosed herein with respect to only one of several concepts or examples or in both broad and narrow terms, the components or features in their broad or narrow conceptions may be combined with one or more other components or features in their broad or narrow conceptions wherein such a combination would be recognized as logical by one of ordinary skill in the art. Also, this one specification may describe more than one invention and the following claims do not necessarily encompass every concept, aspect, embodiment, or example described herein.

The invention claimed is:

1. An integrated circuit device, comprising:
a semiconductor body;
a gate region wrapped around three sides of a fin protruding outward from the semiconductor body;
a fin comprising:
a first epitaxial layer comprising a channel region;
a buffer layer located below the first epitaxial layer;
an insulating layer comprising an insulating material located between the first epitaxial layer and the buffer layer; and
an interface control layer arranged between the first epitaxial layer and the insulating layer, the interface control layer comprising a semiconductor composition having a bandgap larger than that of the first epitaxial layer.

2. The device of claim 1, wherein:
the first epitaxial layer has a first composition; and
the insulating layer has a second composition, that is different than the first epitaxial layer.

3. The device of claim 2 wherein the second composition is an aluminum oxide compound.

4. The device of claim 1, wherein the interface control layer comprises InP, GaAs, Si, or SiGe.

5. The device of claim 1, wherein:
the buffer layer has a thickness in the range from 20 to 300 nm;
the insulating layer has a thickness in the range from 2 to 50 nm; and
the interface control layer has a thickness in the range from 0.5 to 5 nm.

6. The device of claim 1, wherein the first epitaxial layer is a semiconductor material comprising Group III and Group V materials.

7. The device of claim 1, further comprising:
a field oxide arranged over the semiconductor body and below the gate region, and abutting opposing sidewalls of the buffer layer.

8. The device of claim 1, further comprising:
a gate insulating layer abutting an upper surface of the first epitaxial layer and separating the first epitaxial layer from the gate region.

9. An integrated circuit device, comprising:
a semiconductor body; and
a fin protruding outward from the semiconductor body, the fin including:
a channel layer comprising a channel region that laterally separates source and drain regions;
a current-blocking layer arranged directly below the channel layer, the current-blocking layer comprising an oxidized semiconductor material, which electrically isolates the channel layer from the semiconductor body; and
an interface control layer arranged between the channel layer and the current-blocking layer, the interface control layer having a bandgap larger than that of the channel layer.

10. The integrated circuit device of claim 9, wherein the channel layer comprises Si, SiGe, Ge, InAs, InGaAs, InSb, InAsSb, InGaSb, or combinations thereof.

11. The integrated circuit device of claim 9,
wherein the channel layer has a first composition; and
wherein the current-blocking layer has a second composition, different than the first composition.

12. The integrated circuit device of claim 9, wherein the current-blocking layer includes aluminum (Al), gallium (Ga), arsenic (As), indium (In), antimony (Sb), or a combination thereof.

13. The integrated circuit device of claim 9, wherein the interface control layer is formed from a composition selected from the group consisting of: indium phosphide (InP), gallium arsenide (GaAs), silicon (Si), silicon germanium (SiGe).

14. The integrated circuit device of claim 9, further comprising:
a buffer layer of semiconducting material arranged at a location that is between the channel layer and the current-blocking layer.

15. An integrated circuit device, comprising:
a semiconductor body;
a fin formed on the semiconductor body, and comprising:
- a first epitaxial layer comprising a channel region;
- a buffer layer located directly below the first epitaxial layer;
- an insulating layer comprising an insulating material located vertically between the first epitaxial layer and the buffer layer;
- an interface control layer arranged between the first epitaxial layer and the insulating layer, the interface control layer comprising a semiconductor composition having a bandgap larger than that of the first epitaxial layer.

16. The integrated circuit device of claim 15, wherein the insulating layer includes aluminum (Al), gallium (Ga), arsenic (As), indium (In), antimony (Sb), or a combination thereof.

17. The integrated circuit device of claim 15, wherein the interface control layer includes indium phosphide (InP), gallium arsenide (GaAs), silicon (Si), silicon germanium (SiGe), or a combination thereof.

18. The integrated circuit device of claim 15, wherein the insulating layer abuts the buffer layer and the interface control layer, and the interface control layer abuts the first epitaxial layer.

* * * * *